US009548432B2

(12) United States Patent
Cornelissen et al.

(10) Patent No.: US 9,548,432 B2
(45) Date of Patent: Jan. 17, 2017

(54) LIGHT OUTPUT DEVICE AND METHOD OF MANUFACTURE

(71) Applicant: KONINKLIJKE PHILIPS N.V., Eindhoven (NL)

(72) Inventors: Hugo Johan Cornelissen, Escharen (NL); Giovanni Cennini, Eindhoven (NL); Hendrikus Hubertus Petrus Gommans, Eindhoven (NL); Marcellinus Petrus Carolus Michael Krijn, Eindhoven (NL); Martinus Hermanus Wilhelmus Maria Van Delden, Venlo (NL); Leon Wilhelmus Godefridus Stofmeel, Eindhoven (NL); Jianghong Yu, Best (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/057,394

(22) Filed: Mar. 1, 2016

(65) Prior Publication Data

US 2016/0181486 A1    Jun. 23, 2016

Related U.S. Application Data

(62) Division of application No. 14/128,803, filed as application No. PCT/IB2012/053282 on Jun. 28, 2012, now Pat. No. 9,293,650.

(30) Foreign Application Priority Data

Jul. 1, 2011    (EP) .................................... 11172360

(51) Int. Cl.
*H01L 29/18*    (2006.01)
*H01L 33/56*    (2010.01)
(Continued)

(52) U.S. Cl.
CPC ............... *H01L 33/56* (2013.01); *G09F 13/22* (2013.01); *H01L 25/50* (2013.01); *H01L 33/08* (2013.01);
(Continued)

(58) Field of Classification Search
CPC .......... H01L 33/56; H01L 33/58; H01L 25/50; H01L 2933/0033; H01L 2933/0058; H01L 2933/005; H01L 33/52; H01L 2924/0002
(Continued)

(56) References Cited

U.S. PATENT DOCUMENTS 5,738,804 A    4/1998    Cao et al.
6,306,469 B1    10/2001    Serbutoviez et al.
(Continued)

FOREIGN PATENT DOCUMENTS

CN    201162962 Y    12/2008
JP    2010263133 A    11/2010
(Continued)

*Primary Examiner* — Dzung Tran

(57) ABSTRACT

A light output device and manufacturing method in which an array of LEDs is embedded in an encapsulation layer. An array of cavities (or regions of different refractive index) is formed in the encapsulation layer. The cavities/regions have a density or size that is dependent on their proximity to the light emitting diode locations, in order to reduce hot spots (local high light intensity areas) and thereby render the light output more uniform over the area of the device.

7 Claims, 3 Drawing Sheets

(51) Int. Cl.
*G09F 13/22* (2006.01)
*H01L 33/08* (2010.01)
*H01L 33/52* (2010.01)
*H01L 25/00* (2006.01)
*H01L 33/58* (2010.01)

(52) U.S. Cl.
CPC .............. *H01L 33/52* (2013.01); *H01L 33/58* (2013.01); *G09F 2013/222* (2013.01); *H01L 2924/0002* (2013.01); *H01L 2933/005* (2013.01); *H01L 2933/0033* (2013.01); *H01L 2933/0058* (2013.01)

(58) Field of Classification Search
USPC .......................................................... 257/88
See application file for complete search history.

(56) References Cited

U.S. PATENT DOCUMENTS

| | | | |
|---|---|---|---|
| 2002/0180351 A1* | 12/2002 | McNulty | B82Y 20/00 313/512 |
| 2003/0038596 A1* | 2/2003 | Ho | H01L 33/501 313/512 |
| 2005/0179376 A1* | 8/2005 | Fung | H01L 33/58 313/512 |
| 2005/0214963 A1 | 9/2005 | Daniels et al. | |
| 2006/0120112 A1 | 6/2006 | Lin et al. | |
| 2006/0134564 A1 | 6/2006 | Chari et al. | |
| 2006/0257678 A1* | 11/2006 | Benson, Jr. | C08K 7/04 428/542.8 |
| 2007/0008739 A1 | 1/2007 | Kim et al. | |
| 2007/0086179 A1 | 4/2007 | Chen et al. | |
| 2007/0194341 A1* | 8/2007 | Chang | H01L 33/56 257/99 |
| 2009/0116216 A1 | 5/2009 | Kim et al. | |
| 2009/0141512 A1 | 6/2009 | Eberwein | |
| 2012/0051093 A1 | 3/2012 | Kanade et al. | |

FOREIGN PATENT DOCUMENTS

| | | |
|---|---|---|
| WO | 2007046664 A1 | 4/2007 |
| WO | 2008050504 A1 | 5/2008 |
| WO | 2009087584 A1 | 7/2009 |
| WO | 2010129815 A2 | 11/2010 |

* cited by examiner

LIGHT OUTPUT DEVICE AND METHOD OF MANUFACTURE

FIELD OF THE INVENTION

This invention relates to light output devices, particularly but not exclusively using discrete light sources associated with a transparent substrate structure.

BACKGROUND OF THE INVENTION

One known example of this type of lighting device is a so-called "LED in glass" device. An example is shown in FIG. 1. Typically a glass plate is used, with a transparent conductive coating (for example ITO) forming electrodes. The conductive coating is patterned in order to make the electrodes that are connected to a semiconductor LED device. The assembly is completed by laminating the glass, with the LEDs 4 inside a thermoplastic layer (for example polyvinyl butyral, PVB) or an organic resin layer.

FIG. 2 shows the known LED in glass structure in cross section. The device comprises glass plates 1 and 2. Between the glass plates are (semi-) transparent electrodes 3a and 3b (for example formed using ITO or thin conductive wires), and an LED 4 connected to the transparent electrodes 3a and 3b. A layer of electrically insulating material 5 is provided between glass plates 1 and 2 (conventionally PVB or UV resin).

Applications of this type of device are shelves, showcases, facades, office partitions, wall cladding, and decorative lighting. The lighting device can be used for illumination of other objects, for display of an image, or simply for decorative purposes.

Top emitting LEDs can be used, and these have a spot light source output. Side emitting LEDs can also be used, the light output then being coupled to the output from scattering centres in the resin.

To make the spot output more uniform, it is known to apply a reflector or other light shield over the LED, to act as a mask for reducing the local light output intensity. This adds complexity to the manufacture of the device so that there remain difficulties in providing a desired output from the discrete light sources, in terms of illumination direction and illumination spot size, and in a way which does not significantly increase the manufacturing cost.

There is also a desire to create luminescent sheets, preferably thin, with significant flexibility. This enables a wider variety of uses for the product and can also save on expensive moulding procedures in the manufacturing process. An optically transparent material is required with flexibility at the desired thickness of around 1-10 mm.

One example is to place LEDs within a wire grid that is embedded in silicone or other polymer. This design replaces costly Printed Circuit Boards PCBs or glass substrate arrangements. The wire grid, however, does not allow for a small tolerance in the alignment of the LED devices, by virtue of its non-rigid nature.

In order to mask the LED hot spots for LEDs formed in such a grid structure, optical structures (which may simply comprise reflective white paint) can be provided over the LED grid as mentioned above.

An alternative approach is to embed light scattering particles into the polymer structure (which acts as a light guide). The shape or concentration, and the absorption, reflection and transmission properties of these particles, influences how they alter the light output characteristics.

The main drawback of these techniques is that the position of the particles or the optical structures and their scattering properties are determined in the manufacturing process of the system and do not take into account the position of the light sources. This requires a costly alignment of the optics with respect to the light sources. The required optical structures or scattering particles that are used to mask the hot spots require a level of alignment in the range 10-100 micrometers with respect to the LED position. Thus, the accurate alignment of optical structures or particles with respect to the LEDs presents problems.

Prior art document WO2010/129815A2 describes light guide system in which light sources are embedded within the body of a light guide, which light guide comprises light deflecting particles. Said particles may be small bubbles or regions with a different refractive index. The concentration of the light deflecting particles can be varied based on the location of the embedded light sources in order to obtain a desired light emanation pattern. The prior art document is silent about methods to realise such concentration variations.

The present invention aims at providing a light output device of the type described in the previous paragraph, which can produced in a practical manner.

SUMMARY OF THE INVENTION

According to the invention, there is provided a light output device comprising: an array of light sources;
an encapsulation layer within which the light source array is embedded; and
an array of cavities or regions of different refractive index to the refractive index of the encapsulation layer formed in the encapsulation layer,
wherein the cavities or regions have a density or size that is dependent on their proximity to the light source locations and wherein the encapsulation layer (32) comprises a polymer matrix with an additive with a lower boiling point than the matrix.

The cavities are used to scatter the light source light output to result in a more uniform light emission over the surface of the device.

The light sources can comprises LEDs, although other light output devices can be used.

By making the cavity/region density or size dependent on the proximity to the light sources, a self assembly of the cavities in the encapsulating layer can be used. The light is reflected and refracted at the interfaces of the cavities/regions with the encapsulation material. No absorption takes place in this case, whereas particles immersed in the medium suffer at least a degree of light absorption. The cavity/region formation can be easily controlled by the manufacturing process.

The encapsulation layer comprises a polymer matrix with an additive with a lower boiling point than the matrix. The additive can then be evaporated to form small gas filled cavities before curing the polymer matrix The additive can be evaporated by the heat of the light sources or the light of the light sources.

Alternatively, the encapsulation layer can comprise a phase-separated polymer-dispersed liquid. The light output can be used to induce the polymerization reaction in a mixture of monomers and a non-polymerizable liquid. When the polymerization reaction has resulted in the formation of a network of polymer walled cavities, the non-polymerized liquid material can be washed away to form cavities.

Optionally the cavities can be re-filled with a second polymer or liquid.

The invention also provides a method of manufacturing a light output device, comprising:

embedding an array of light sources into an encapsulation layer;

forming an array of cavities or regions of different refractive index to the refractive index of the encapsulation layer, in the encapsulation layer, the cavities having a number density or size that is dependent on their proximity to the light source locations.

BRIEF DESCRIPTION OF THE DRAWINGS

Examples of the invention will now be described in detail with reference to the accompanying drawings, in which:

FIG. 4 shows how the light sources induce local heating when they are turned on;

DETAILED DESCRIPTION OF THE EMBODIMENTS

Figure 1:
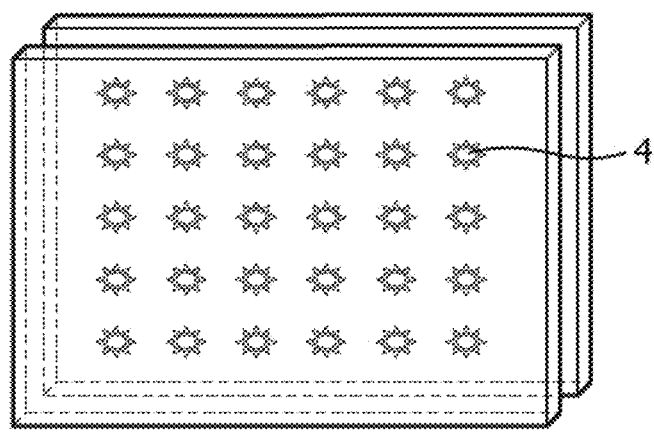
FIG. 1 schematically shows a known LED in glass illumination device.
Figure 2:
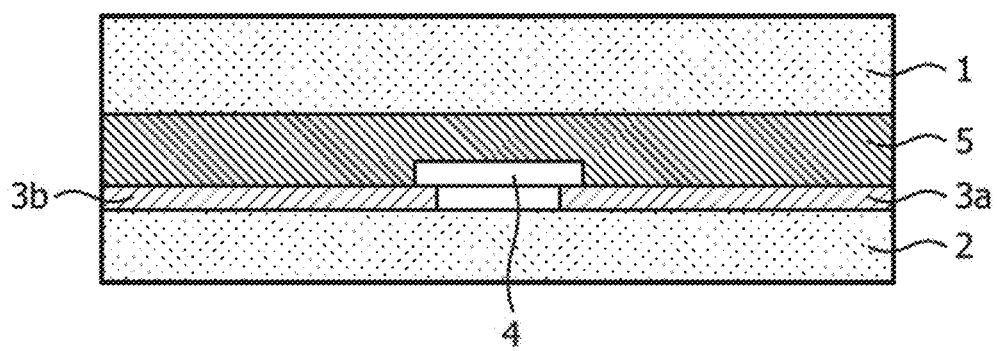
FIG. 2 schematically shows an example of the structure of the device of FIG. 1.

The same reference numerals are used to denote similar parts throughout the Figures.

The invention provides a light output device and manufacturing method in which an array of LEDs is embedded in an encapsulation layer, and an array of cavities (or regions of different refractive index) is formed in the encapsulation layer. The cavities/regions have a density or size that is dependent on their proximity to the light emitting diode locations, in order to reduce hot spots (local high light intensity areas) and thereby render the light output more uniform over the area of the device.

Figure 3A:
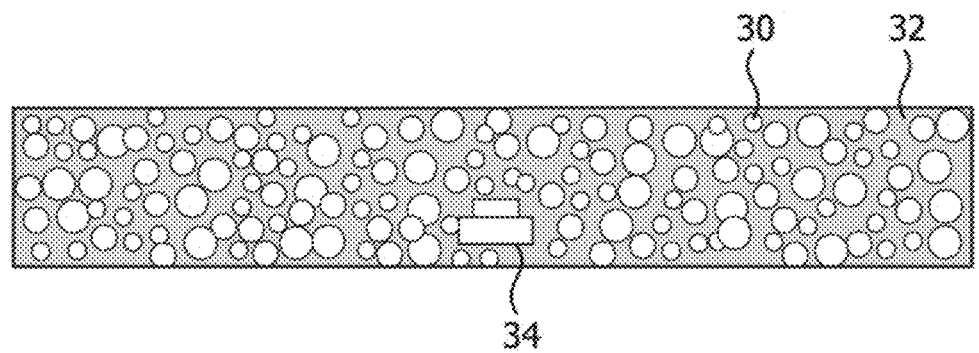
FIG. 3(a) shows a known approach in which cavities are formed in an encapsulation layer in which LEDs are embedded.

FIG. 3(a) shows a known approach in which cavities 30 are formed in an encapsulation layer 32 in which LEDs 34 are embedded. In FIG. 3(a) the cavities are uniformly distributed in the medium, and they comprise a uniformly distributed arrangement of bubbles that fills the polymer of the encapsulation layer. However, hot spots are still present.

Figure 3B:
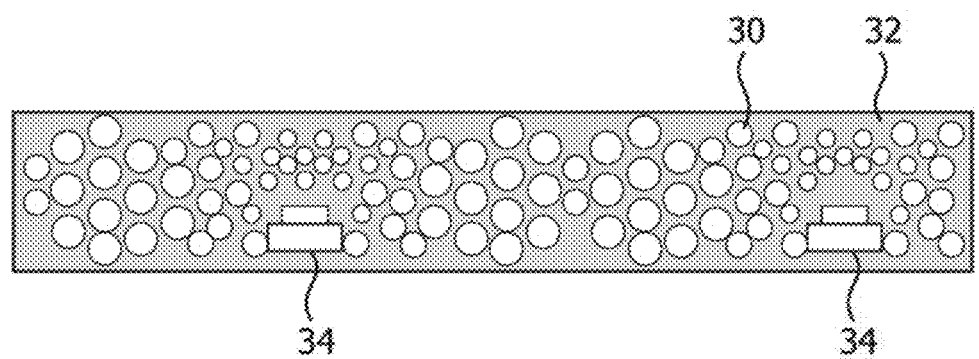
FIG. 3(b) shows the approach of the invention in which cavities are formed with a density or size that is dependent on their proximity to the light source locations.

The invention provides cavities or regions of different refractive index with a number density or size that is dependent on their proximity to the LED locations as shown in FIG. 3(b). In particular, the cavities/regions are smaller and therefore more densely packed near the LEDs. This results in stronger light backscattering close to the LEDs, less escape of light close to the LEDs, and hence better spreading of the light.

The LED 32 can be connected and a wire grid also embedded in the transparent encapsulation layer 30. This layer may be silicone, but other materials may be used, such as PMMA, PVC, PU (polyurethane), PC (polycarbonate), PET, PES or PEN for example. The encapsulation layer functions as a light guiding material, and is a generally a transparent polymer.

The thickness of the encapsulation layer is around 1 to 10 mm.

The wire grid can comprise electrically conductive wires that can deliver the electrical current to the LEDs, e.g. copper wires of diameter 0.25 mm.

The wire grid and connected LEDs is formed by an industry-standard pick-and-place assembly and soldering process and the encapsulation is formed by casting or coating.

The LEDs are typically discrete off the shelf components, and have a typical size of 2×3 mm and a height of 0.5-1 mm, and are spaced by 10 to 50 mm, depending on the requirements of the application.

The dependency of the cavity/region properties on the proximity to the LED is achieved by using light or thermal radiation (heat) with a spatial pattern in order to locally create cavities/regions.

A first example employs self formation of cavities by differential heating across two different temperatures.

Figure 4:
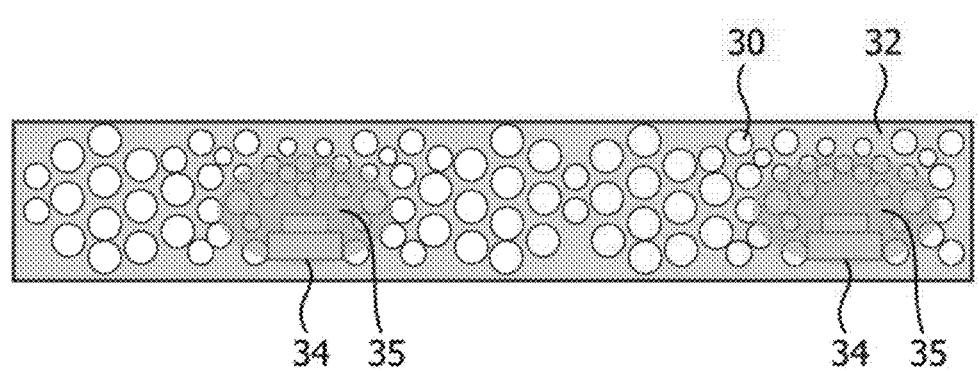

FIG. 4 shows how the LEDs 32 induce local heating of regions 35 when they are turned on.

The encapsulation layer comprises a polymer matrix with an additive with a lower boiling point than the matrix. The difference between the polymerization temperature of the main encapsulation material and the boiling temperature of the additive is used to control evaporation of the additive before solidification of the polymer. The encapsulation layer thus comprises of a set of LEDs immersed in a polymer with the additive.

The LEDs can be interconnected by a wire grid as mentioned above, but this is not essential. The LED positioning can be regular or random or pseudo-chaotic.

The polymer of the light guiding material has a polymerization temperature and time constant of $T_p$ and $t_p$, respectively. The time constant $t_p$ depends on the temperature $T_p$.

The additive has a low boiling point $T_2$ and associated time constant $t_2$. This time constant $t_2$ is the time constant associated with bubble coalescence: small bubbles tend to coalesce to form large bubbles. Thus, there is a degree of freedom: either create a high density of small bubbles and prevent them to coalesce by timely inducing the final polymerization at $T_p$ (relatively long $t_2$), or locally promote the formation of large coalesced bubbles (relatively short $t_2$).

In this first example, the encapsulation layer and its additive are locally heated by the radiation of the light sources.

The LEDs can be cycled on and off to maintain the desired temperature (between $T_p$ and $T_2$) to cause evaporation of the additive before polymerisation of the main encapsulation material layer In a second example, instead of using the local heating induced by the LEDs, the cavities can be formed by differential heating using a heating mask or an externally induced gradient. Thus, the encapsulating layer is exposed to external thermal radiation that has a spatial and temporal gradient.

Figure 5:
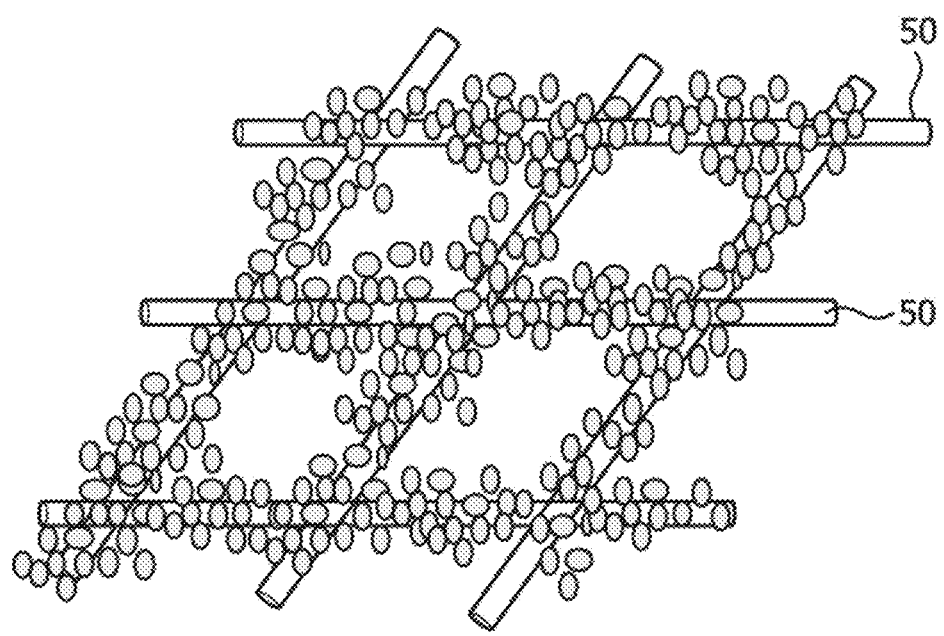
FIG. 5 shows how a temperature pattern can be realized by a mesh arrangement of wires.

The temperature pattern can be realized by a mesh arrangement of wires that conduct current, as schematically shown in FIG. 5. The wire mesh 50 causes local boiling/evaporation of the additive, so that the density or the size of the cavities is different near the wires. The wire mesh 50 is positioned and aligned on the encapsulation layer and has maximum aperture where the LEDs are positioned.

As explained above, the formation of smaller more densely numbered cavities near the light sources is one option, and the creation of larger cavities away from the light sources (using the wire grid for example) is another option.

In an alternative embodiment, the LED interconnection wires themselves serve the purpose of locally heating the polymer. Typically the LEDs are connected in groups. First a group of N LEDs are connected in parallel. Subsequently, M of these groups are connected in series to form an N×M connected LED array. Each of the wires that connects a group of LEDs in parallel can be used as a heater wire to achieve the desired effect. There will be no current flowing through the LEDs, and no heat is generated in the LEDs.

Figure 6:
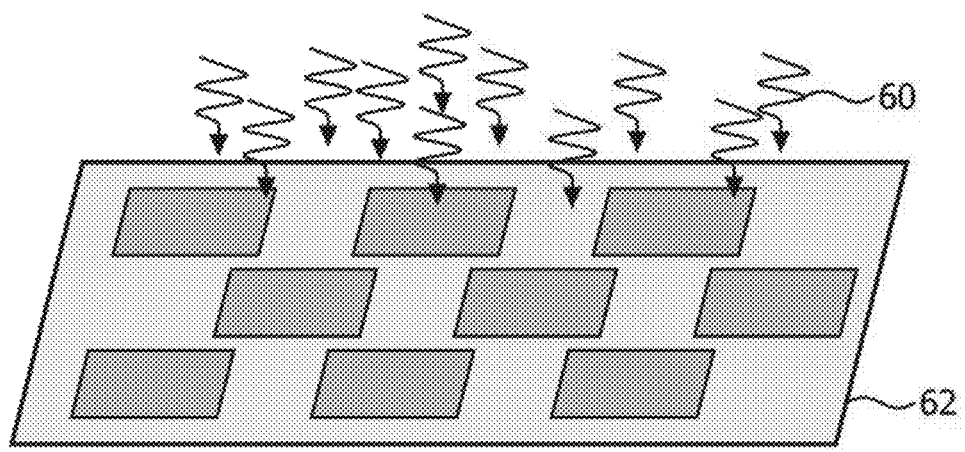
FIG. 6 shows how cavities can be formed by externally applied light.
Figure 6:
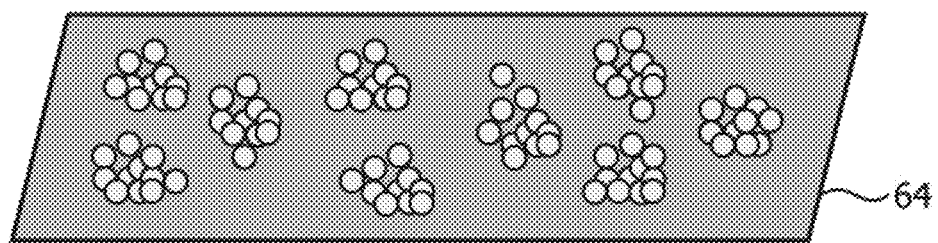

In a further embodiment shown in FIG. 6, cavities are formed by externally applied light.

The encapsulation material can have a low boiling point additive as in the examples above. However, an alternative is the use of a substance that allows phase separation to take place.

An external light source 60 is used which accelerates the cavity formation in the polymer, because of light induced polymerization or light induced chemical bonding. A physical mask 62 is placed between the external light source and the encapsulation material 64.

The polymer of the encapsulation layer is thus irradiated by light of a suitable wavelength. The mask creates the spatial gradient necessary to have a spatial variation of the cavities.

For the polymer for instance Merck PN393 or Norland 73 can be used, and for the additive TL205, a liquid crystal mixture from Merck. These material combinations are known to form so-called Polymer Dispersed Liquid Crystal layers, where phase separation has taken place between the polymer matrix and the liquid crystal phase.

The phase change approach can also be employed using the LEDs themselves as the light source, as in the examples above.

Instead of forming the cavities using the light source, the formation of cavities can be slowed by light, for example by the light emitted by the embedded LEDs.

Another variation is to use phase separation by photo-polymerization.

It is known that a mixture of two miscible liquids can phase separate by polymerization of one of the components. This is for instance also the case in so-called Polymer Dispersed Liquid Crystal (PDLC) material mentioned above, where a polymer matrix forms by thermal activation, or solvent evaporation of photo-polymerization. In the case of PDLC, a co-continuous phase is formed, meaning that both the polymeric phase and the liquid crystal phase are continuous materials (with no cavities, but sponge-like).

The liquid phase can thus be washed away, leaving an air-filled sponge-like polymer matrix.

A material system similar to the polymer-dispersed liquid crystal material compound system can be used, where the phase separation of the polymeric compound is induced by the light of the LEDs and where the liquid phase is washed away and replaced by air. Hence a self-aligned polymeric network is formed in the vicinity of the LEDs. Another variation is to use phase separation of two polymers with different index of refraction.

The monomers of two polymers can be miscible on a molecular scale, depending on temperature and pressure. The resulting mixture has an effective index of refraction, determined by well-known mixing rules.

If a polymerization reaction is started in one of the monomers, for instance by UV exposure, polymer domains start to form and the miscibility of the mixture can be strongly reduced: phase separation will occur. The polymer domains will grow by mass diffusion of the first monomer. If the size of the domains approaches the optical dimension (microns) then light scattering will start to occur because the index of refraction starts to show strong discontinuities on the polymer domain boundaries.

Subsequently the second monomer can also be made to polymerize, for instance by heating and a new phase-separated material has been formed.

Thus, a mixture of two or more monomers can be made to phase-separate under the influence of LED light. Subsequently after phase separation all monomers are made to polymerize in order to stabilize the compound material.

The same material examples can be used as outlined above, namely Merck PN393 or Norland 73 can be used for the polymer, and TL205 for the additive.

Another example uses an externally applied temperature profile.

The formation, density and size of cavities can be gradually changed across the thickness of the film (normal to the plane) by applying an external temperature profile across the polymer, for example hot at the bottom and cooler at the top surface (or vice versa). Alternatively, an alternating profile (normal to the plane) of hot and cold regions can be applied in checker board fashion, to create built-in patterns.

The invention is of particular interest for signage, decorative lighting such as lamps, windows, architectural glass, and secrecy windows, as well as for backlighting of LCDs. Other applications are possible, such as furniture and other decorative items.

The examples above are based on LEDs. However, the LEDs can be replaced by any other light source (bulb, CFFL, CFL, OLEDs).

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A method of manufacturing a light output device, comprising:
    embedding an array of light sources into an encapsulation layer;
    forming an array of cavities or regions of different refractive index to the refractive index of the encapsulation layer, in the encapsulation layer, the cavities or regions having a number density or size that is dependent on their proximity to the light source locations, the cavities being more densely packed and having a smaller diameter near the light source locations causing stronger light backscattering close to the light source locations, and wherein an array of cavities is formed by evaporating an additive in the encapsulation layer, wherein the encapsulation layer comprises a polymeric matrix and the additive has a lower boiling point than the matrix.

2. A method as claimed in claim 1, wherein the additive is evaporated by the heat of the light sources.

3. A method as claimed in claim 1, wherein the additive is evaporated by the light of the light sources.

4. A method as claimed in claim 1, wherein the additive is evaporated by the light or heat of an external source.

5. A method as claimed in claim 1, wherein an array of cavities is formed by washing away the liquid compound of a phase-separated polymer-dispersed liquid.

6. A method as claimed in claim 1, wherein an array of regions are formed by phase separation of a monomer mixture under the control of the light source light output.

7. A method as claimed in claim 1, wherein an array of cavities filled with a polymer is formed.

* * * * *